United States Patent [19]
Broich et al.

[11] Patent Number: 4,829,348
[45] Date of Patent: May 9, 1989

[54] DISCONNECTABLE POWER SEMICONDUCTOR COMPONENT

[75] Inventors: Bruno Broich, Baden; Jens Gobrecht, Gebenstorf; Peter Roggwiller, Neerach-Riedt; Jan Voboril, Nussbaumen, all of Switzerland

[73] Assignee: BBC Brown, Boveri & Company Limited, Baden, Switzerland

[21] Appl. No.: 148,136

[22] Filed: Jan. 27, 1988

Related U.S. Application Data

[63] Continuation of Ser. No. 778,965, Sep. 23, 1985, abandoned.

[30] Foreign Application Priority Data

Oct. 19, 1984 [CH] Switzerland ............................ 5016/84
Jul. 13, 1985 [EP] European Pat. Off. ......... 85108766.8

[51] Int. Cl.4 ........................................... H01L 29/78
[52] U.S. Cl. ........................................ 357/22; 357/38; 357/55; 357/89; 357/90
[58] Field of Search ..................... 357/22, 38, 55, 89, 357/90

[56] References Cited

U.S. PATENT DOCUMENTS

| | | | |
|---|---|---|---|
| 3,935,501 | 1/1976 | Sterbal | 357/75 |
| 4,037,245 | 7/1977 | Ferro | 357/38 |
| 4,218,695 | 8/1980 | Egerbacher et al. | 357/75 |
| 4,492,975 | 1/1985 | Yamada et al. | 357/79 |
| 4,514,747 | 4/1985 | Miyata et al. | 357/38 |
| 4,547,686 | 10/1985 | Chen | 307/570 |
| 4,571,815 | 2/1986 | Baliga et al. | 357/22 E |
| 4,639,759 | 1/1987 | Neidig et al. | 357/75 |
| 4,649,416 | 3/1987 | Borkowski et al. | 357/75 |
| 4,651,035 | 3/1987 | Shigekane | 307/570 |
| 4,663,547 | 5/1987 | Baliga et al. | 307/570 |

FOREIGN PATENT DOCUMENTS

| | | | |
|---|---|---|---|
| 3211975 | 10/1982 | Fed. Rep. of Germany | 357/75 |
| 54-57984 | 5/1979 | Japan | 357/75 |
| 59-215762 | 12/1984 | Japan | 357/75 |

Primary Examiner—Edward J. Wojciechowicz
Attorney, Agent, or Firm—Oblon, Fisher, Spivak, McClelland & Maier

[57] ABSTRACT

A field-controlled thyristor having a sequence of layers consisting of anode layer, channel layer and gate regions and cathode regions, which regions are alternately arranged at the cathode side, wherein an improvement in the turn-off gain is achieved by a p-type doping of the side walls of the troughs which separate the cathode regions from each other, and/or by an additional intermediate layer which has low p-type doping and which is arranged between adjacent gate regions.

12 Claims, 5 Drawing Sheets

DISCONNECTABLE POWER SEMICONDUCTOR COMPONENT

This application is a Continuation of application Ser. No. 778,965, filed on Sept. 23, 1985, now abandoned.

BACKGROUND OF THE INVENTION

1. Field of the Invention

This invention relates to a disconnectable power semiconductor component, and more particularly to a field-controlled thyristor of the type which is described, for example, in publication DE-A No. 2,855,546.

2. Discussion of Background

Field-controlled power semiconductor components are known as having different structures and by various names. Within these known components, two functional types are mainly distinguished, which are unipolar structures such as, for example field-effect transistors of the MOSFET or JFET type having majority carrier conduction, and components having bipolar carrier injection such as, for example the FCT (Field Controlled Thyristor) or the SITh (Static Induction Thyristor).

For applications in the high performance field, especially the last-mentioned bipolar structures, the action of which is explained in greater details in the above-mentioned publication and in DE-A No. 3,002,526, are of interest for physical reasons.

DE-A No. 2,932,043, DE-A No. 2,824,133, or IEEE Transactions ED-29 (1982) 1560, or IEDM Technical Digest 1984, 439, and EP-A No. 0,121,068 are also relevant publications.

As a rule, the action of the conventional structures is based on applying the JFET principle for control: in finely distributed gate or control zones, application of a negative gate voltage generates areas with charge carrier depletion, which, with rising gate voltage, extend into a channel region which conducts the current and finally interrupt the current flow by pinching off the channel region.

The pinching-off process is counteracted by the anode voltage present at the component so that with increasing anode voltage, an increasing gate voltage is also required for blocking or switching-off the component. The ratio between the anode voltage and the gate voltage needed for blocking is called turn-off gain.

There is a close connection between the turn-off gain and the geometric arrangement and design of the gate zones, which results from the fact that for blocking a certain voltage by means of the gate voltage applied, a "penetration" through the field-controlled channel must be prevented.

In the blocking state, the positive space charge in a JFET structure with n-doped channel produces a positive curvature of the associated potential surfaces. However, to prevent an injection of electrons from the cathode-side $n^+$ emitter into the channel, the potential must not become greater than zero at this point. This can be achieved if it is possible to make the curvature of the potential surface negative in the axial direction in the channel.

For this purpose, a correspondingly large positive curvature component must be generated in the lateral direction by the negative gate voltage at the $p^+$ gate regions in the known components. But the amount of this component is essentially determined, in addition to the gate voltage, by the difference of the adjacent gate regions. It follows from this that in a structure of the known type an increase in the turn-off gain can be achieved in principle only by reducing the distances between the gate regions, that is to say by an even finer subdivision of the gate-cathode structure.

SUMMARY OF THE INVENTION

Accordingly, one object of this invention is to provide a novel field-controlled thyristor which, in comparison with a field-controlled thyristor of the conventional type, has significantly higher turn-off gain, assuming the same gate-cathode geometry.

The object of the present invention is achieved by rpoviding a novel disconnectable power semiconductor component having a p-type anode layer above which a n-type channel layer is located, and a plurality of n-type cathode regions and p-type gate regions, which are alternately arranged at the cathode side, wherein the cathode regions are separated from each other by troughs and the gate regions extend both over the bottoms and over the side walls of the troughs, and/or a continuous intermediate layer with low p-type doping is provided between adjacent gate regions.

The main feature of the invention consists in generating the required negative curvature of the potential surfaces in the n channel by the fact that in a field controlled thyristor with a vertically structured cathode surface in accordance with European Auslegeschrift No. 0,121,068, the gate regions also extend over the side walls of the troughs and, additionally or as an alternative to this, an intermediate layer with low p-type doping is provided in the channel region between two gate regions.

The pn junctions produced between the n-type cathode regions and the p-type gate regions at the side walls of the troughs must be designed in such a manner that they can block the gate-cathode voltage. When the negative blocking voltage is then applied, the load count is blocked and the anode voltage is cut off. Thickness and doping concentration of the p-type intermediate layer are selected in such a manner that the corresponding space charge zone contacts the $n^+$ emitter even with comparatively small anode voltages and an open gate contact, and thus switches on the thyristor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
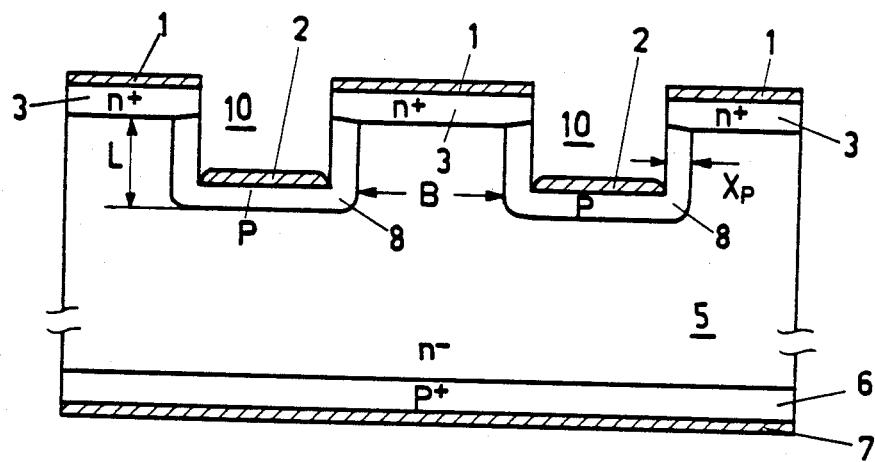
FIG. 1 is a side view, partly in cross-section, of a field-controlled thyristor having a vertically structured gate-cathode structure in accordance with the invention.

Referring now to the drawings, wherein like reference numerals designate identical or corresponding parts throughout the several views, and more particularly to FIG. 1 thereof a thyristor having a vertically, structured cathode surface is shown. The thyristor includes an anode layer 6 with p+-type doping on which a channel layer 5 with n±-type doping is located, and on the cathode side a finely subdivided gate-cathode structure which is composed of alternately arranged gate regions 8 with p-type doping and cathode regions 3 with n+-type doping. Cathode contacts 1 and anode contacts 7, which are usually constructed as vapor-deposited metal layers are provided for supplying the load current.

The individual cathode regions 3 are separated from each other by deep troughs 10. The gate contacts 2 are arranged at the bottoms of the troughs 10 and the gate regions 8 with p-type doping extend both over the trough bottoms and over the trough walls.

By applying a negative gate voltage $U_{GK}$ to the gate contacts 2, depletion regions are produced at the pn junction between the gate regions 8 and the channel layer 5, which depletion regions extend into the channel region between the gate regions 8 and pinch off the current flowing between the anode layer 6 and the cathode region 3 until it is cut off. The total anode voltage $U_{AK}$ is then dropped across the element. The ratio $U_{AK}/U_{GK}=\beta$ is called turn-off gain. $\beta$ is in a complicated manner dependent on various parameters such as component thickness, doping in the channel layer 5, width $X_E$ of the cathode region 3 and the ratio L/B. In this, L is the perpendicular distance of the junction between the cathode areas 3 and the channel layer 5 from the junction between the gate region 8 at the bottom of the troughs 10 and the channel layer 5. B is the distance between the adjacent junctions of the gate areas 8 at the walls of the troughs 10 and the channel layer 5.

Figure 8:
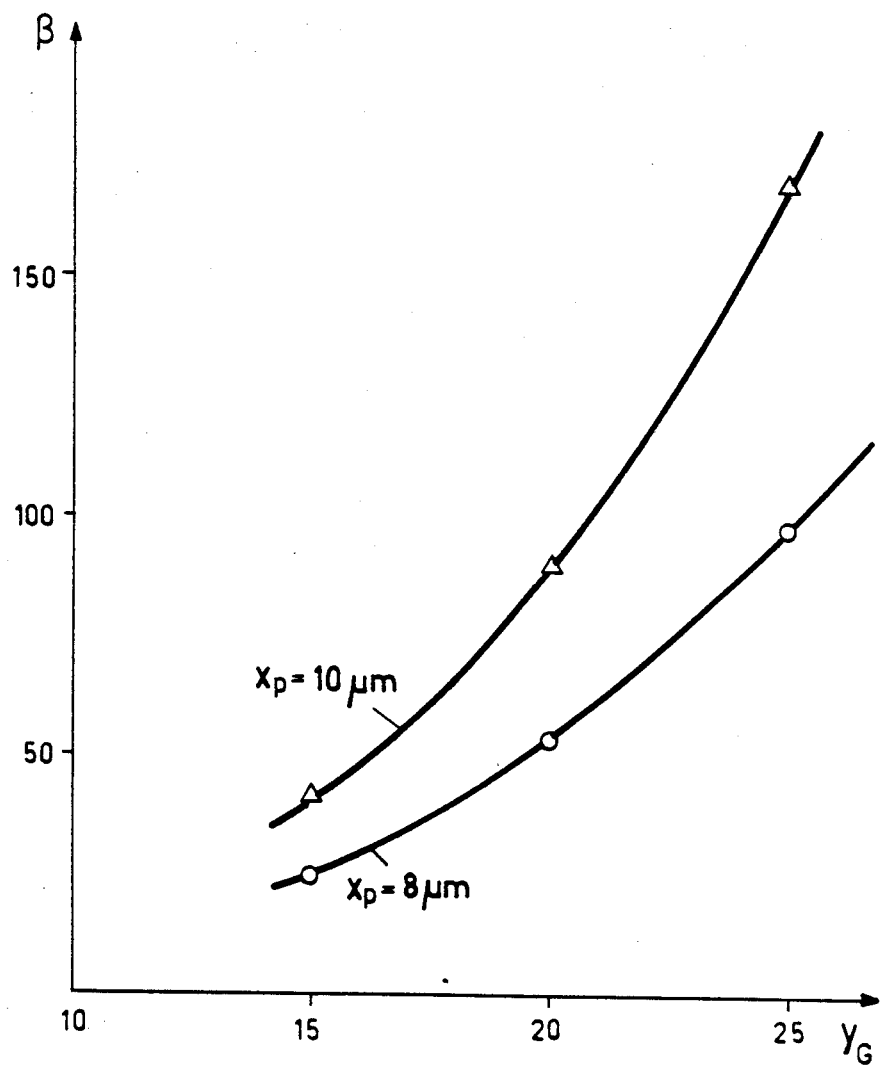
FIG. 8 is a graph showing the dependence of the turn-off gain $\beta$ for the depth $Y_G$ of the troughs in structures according to FIGS. 1 and 2.

The structure according to the invention according to FIG. 1 can be used for achieving extraordinarily high turn-off gains without the gate-cathode geometry having to be significantly changed as compared with the conventional thyristors:

Thus, according to FIG. 8 and a structure according to FIG. 1, a turn-off gain of greater than one hundred is achieved for a width $X_E$ of the cathode regions 3 of 30 $\mu$, a thickness of the component of 300 $\mu$m and an n-type doping concentration in the channel layer 5 of $3.5 \times 10^{13}$ cm$^{-3}$(=150$\Omega$cm) with an anode voltage $U_{AK}$ of 1600 V. A determining role in this is played by the trough depth $Y_G$, on the one hand, and the depth $X_P$ of the pn junction between gate region 8 and channel layer 5, on the other hand.

FIG. 8 shows the dependence of the turn-off gain $\beta$ on the trough depth $Y_G$ for parameter $X_P$ for the values of $X_P=8$ $\mu$ and $X_P=10$ $\mu$. As can be seen, higher turn-off gains $\beta$ are achieved for greater values of $X_P$, that is to say narrower n-type channels under the cathode regions 3, than for smaller values of $X_P$. For example, $\beta=55$ for $Y_G=20$ $\mu$ and $X_P=8$ $\mu$ and $\beta=90$ for $Y_{G\neq}=20$ $\mu$ and $X_P=10$ $\mu$.

Figure 5:
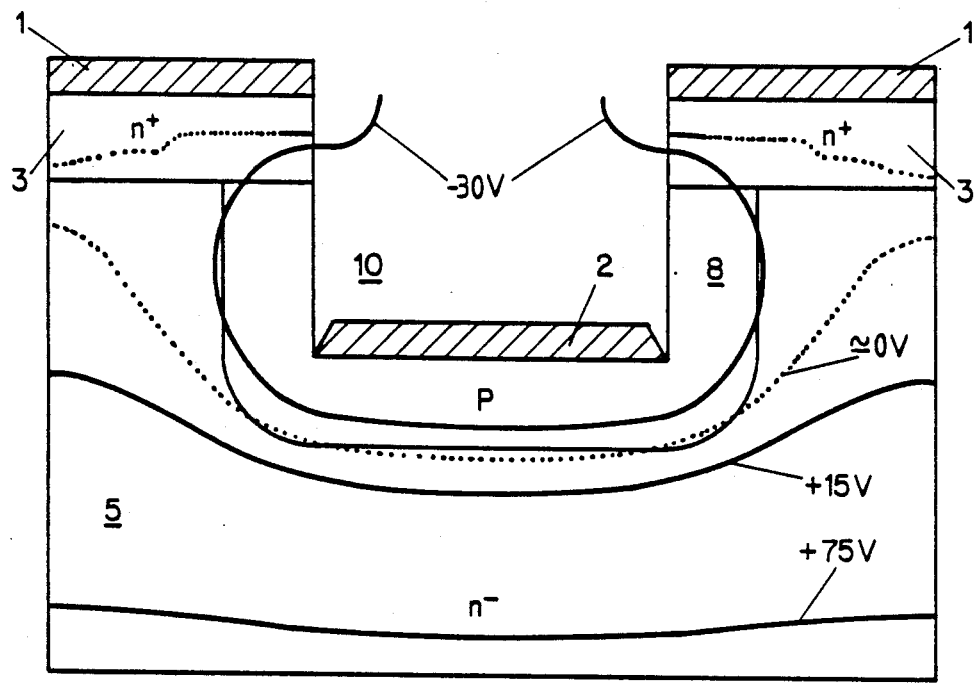
FIG. 5 is a side view, partly in cross-section, of a thyristor according to FIG. 1, but also showing calculated equipotential lines when in the blocking state.
Figure 6:
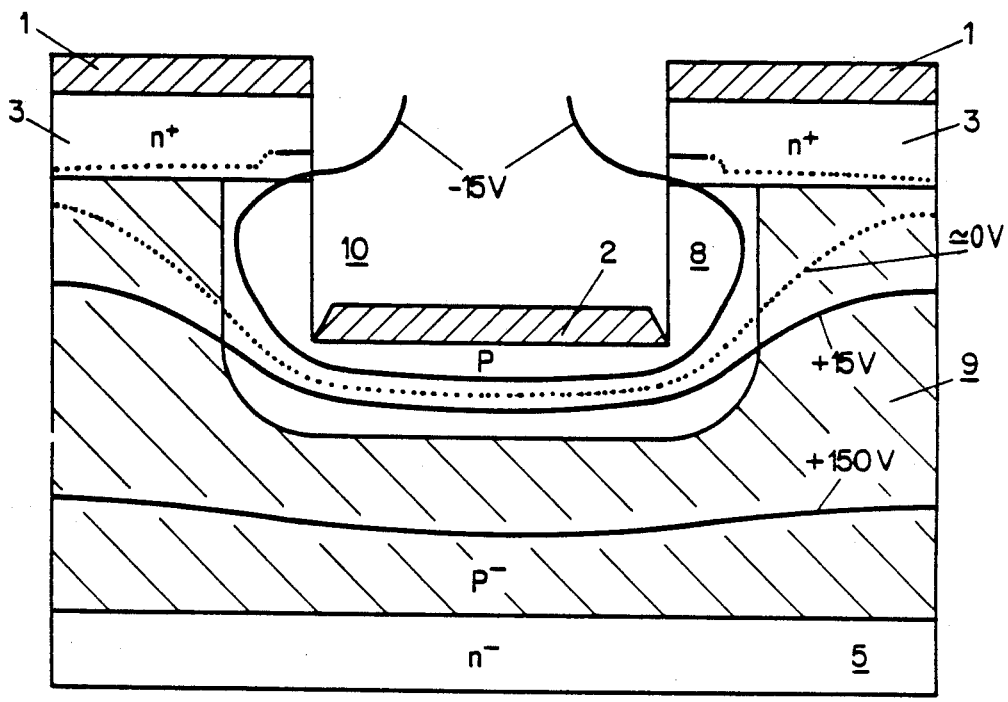
FIG. 6 is a side view, partly in cross-section, of a thyristor according to FIG. 4, but also showing equipotential lines when in the blocking state.

The conditions of potentials in the blocking state for a gate voltage $U_{GK}=-30$ V are shown in FIG. 5. As can be seen, the anode potential $U_K$ in the channel layer 5 under the cathode regions 3 is modified in such a manner that a potential barrier is produced which interrupts the electron emission from the cathode region 3. FIG. 6 shows that in the case of a p⁻-type channel layer 9, the blocking state is already reached with an applied gate voltage of $U_{GK}=-15$ V, the geometry being otherwise identical to those in FIG. 5.

These examples explain how the blocking characteristic of a field-control thyristor is very advantageously influenced by the structure according to the invention. The greater the L/B ratio, the greater $X_P$, the greater the turn-off gain. The invention can be successfully implemented for values of $Y_G=10\ldots 30$ $\mu$, $X_E=6\ldots 40$ $\mu$, $X_P=2\ldots 10$ $\mu$ and an edge concentration of the doping of $2\times 10^{16}$ cm$^{-3}$ maximum in the gate regions 8. This last-mentioned limit value is of importance for the pn junction between the cathode region 3 and the gate region 8 to be able to accept, that is to say block, a negative gate voltage $U_{GK}$ of up to 50 volts.

Figure 2:
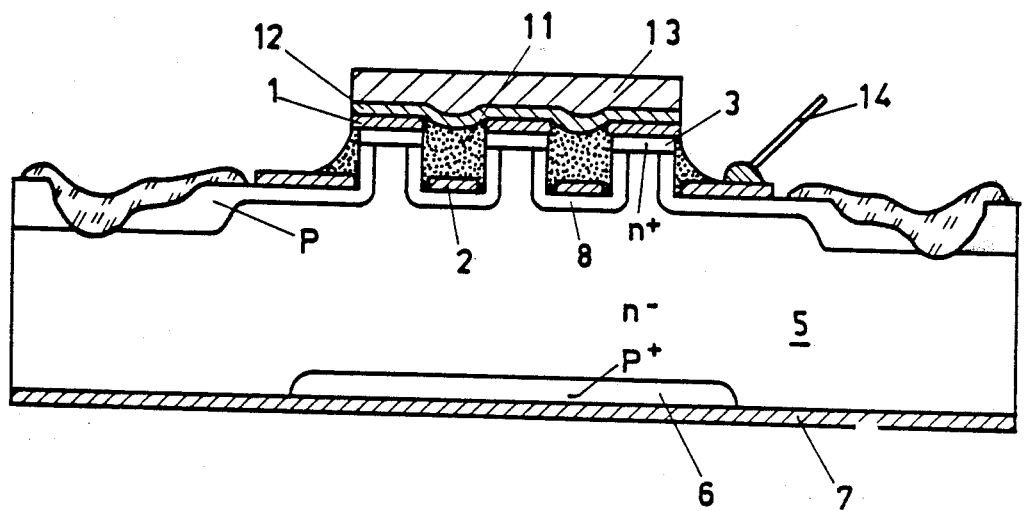
FIG. 2 is a side view, partly in cross-section, of a thyristor having the structure according to FIG. 1, in completed condition.

In FIG. 2, the structure of FIG. 1 is shown diagrammatically as a complete component with edge contouring and passivation. The troughs 10 are filled up with an insulating layer 11 which covers the gate electrodes and the side walls. The insulating layer consists preferably of a material, for example polyamide, which is resistant with respect to soldering temperatures, at least 300° C. Over the cathode contacts 1 and the insulating layer 11, a continuous metal layer 12 extends which preferably consists of a sequence of layers of Cr, Ni and Ag so that it can be easily soldered. The metal layer 12 is surface-connected to the metallic external contact 13 which can be inserted into the load circuit, for example by forming a pressure contact. The gate contacts 2 form a clearer metal layer which encloses the finger-like cathode regions 3 to which an electrical voltage can be applied from the outside via the gate connection 14.

Figure 7A:
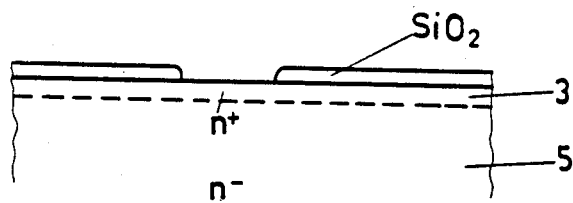
FIGS. 7a–7e are schematic side Views illustrating of suitable process steps for producing a structure as in FIGS. 1 and 2.
Figure 7B:
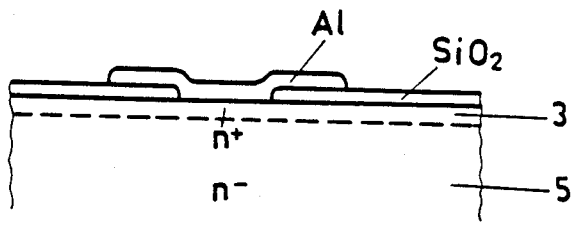
Figure 7C:
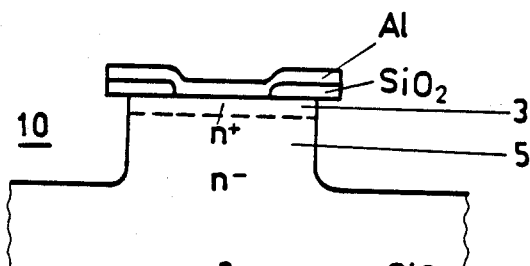
Figure 7D:
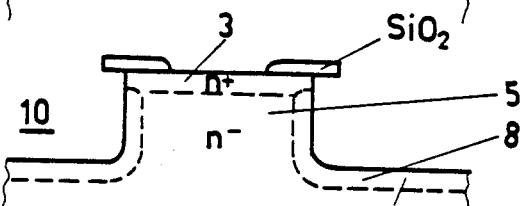
Figure 7E:
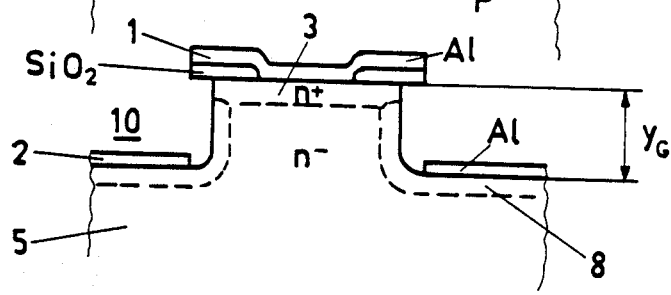

A structure according to FIGS. 1 and 2 can be advantageously produced by process steps indicated in FIG. 7:

A silicone substrate with weak n-type doping (approximately 150$\Omega$cm), which is provided at its end face with a diffused n+-type layer, is first provided with a SiO$_2$ cover layer of approximately 1 $\mu$ thermal oxidation. Using a first mask, a window is etched into this SiO$_2$ layer in known manner over the later cathode regions 3 (FIG. 7a). After that, an Al layer of a thickness of approximately 2 = is vapor deposited and this Al layer is photo-lithographically structured by means of a second mask in such a manner that the later cathode regions 3 sway themselves and, beyond, an edge land extending into the area of the later troughs 10 are left standing (FIG. 7b). After that, the troughs 10 are created by means of an isotropic reactive ion etching, during which process the remaining Al regions act as etching masks (FIG. 7c). The ion etching removes, for example, 20 $\mu$. After that, the Al regions are etched away and the gate regions 8 are generated by boron diffusion with an edge concentration of approximately $10^{16}$ cm$^{-3}$ and a depth $X_P$ of approximately 5 $\mu$ (FIG. 7d). Finally, Al is selectively vapour deposited to generate the cathode contacts 1 and the gate contacts 2 (FIG. 7e). The edge of the SiO₂ layer projecting into the trough 10 now plays an important role: it prevents a conductive Al layer, which would lead to a short circuit, from being able to precipitate on the side walls of the troughs 10 during the vapour deposition process.

In the structure shown in FIG. 7, the gate region 8 directly adjoins the cathode region 3. This is then the preferred embodiment. However, it is also possible to seperate the two regions 3, 8 from each other, for example by ensureing at the start that the n-type doping is diffused in through the window in the SiO₂ layer only in the space of the later cathode region 3. Instead, the cathode region 3 can also be generated by ion implantations after creation of the gate regions 8 by diffusion of boron, Al, Ga or similar.

In this connection, it is also of importance that the walls of the troughs 10 are perpendicular to their bottoms: as a result, the shading effect by the overhanging SiO₂ edge is achieved in the selective Al vapour deposition process in the step according to FIG. 7e.

The distances L and B in FIG. 1 are a measure of the length and the width of the n-type channels under the cathode regions 3. They can be adjusted by means of adjusting the depth of the p-type diffusion in producing the gate regions 8. The deeper the p-type doping profile diffused in, that is to say the deeper the pn junction gate region 8/channel layer 5 or the greater $X_P$, the greater the L/B ratio will be which, as mentioned, is a measure of the blocking capability of the structure.

Figure 3:
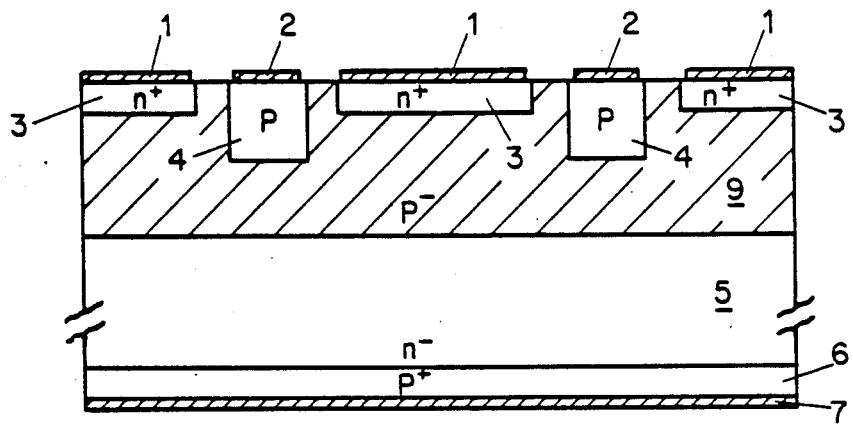
FIG. 3 shows a thyristor according to the invention, including a gate located at the surface and a p-type intermediate layer.
Figure 4:
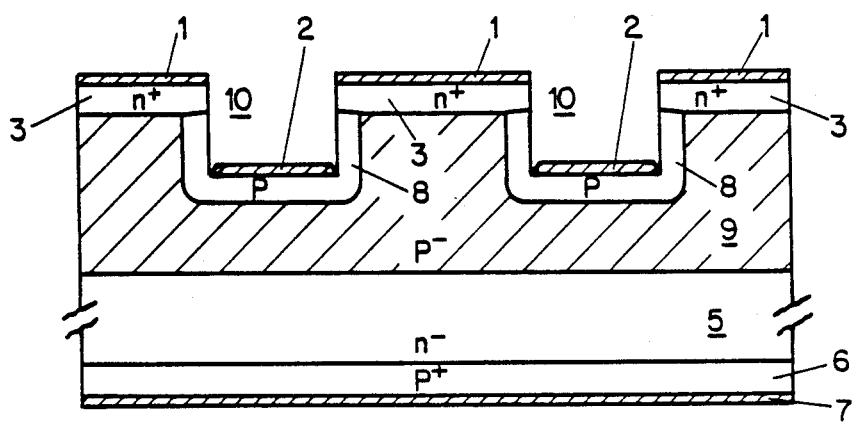
FIG. 4 is a side view, partly in cross-section, of a thyristor according to the invention in accordance with FIGS. 1 and 2, including a p-type intermediate layer.

According to the invention, an intermediate layer 9 with low p-type doping is provided in the channel layer 5 between the gate regions 4, 8 in FIGS. 3 and 4.

The intermediate layer 9 in FIG. 3 extends not only between the adjacent gate regions 4 but continuously also under the complete gate-cathode structure and thus completely separates not only the cathode regions 3 but also the gate regions 4 from the base layer 5 with n⁻-type doping.

The intermediate layer 9 preferably has a p-type doping with a concentration of less than $1 \times 10^{15}$ cm⁻³. It is of particular advantage for switching on at low voltage to provide doping within a range of only $1 \times 10^{14}$ cm⁻³.

The depth of the intermediate layer 9 below the surface defined by gate contacts 2 and cathode contacts 1 is advantageously selected in such a manner that it approximately corresponds to twice the depth of the gate regions 4. If, therefore, for example gate regions 4 are provided which project approximately 15 μ into the component, the thickness of the intermediate layer is correspondingly 30 μ at its thickest point.

Analogously, the turn-off gain of a structure according to FIG. 1, 2 is increased by an intermediate layer with low p-type doping according to the illustrative embodiment of FIG. 4. The preferred doping concentrations of the intermediate layer 9 are, in this case, the same as in the illustrative embodiment of FIG. 3. The depth of the intermediate layer 9 in this case depends on the depth of the troughs 10 and is preferably twice the depth of this trough depth.

The influence of the intermediate low p-type doping layer 9 according to the invention, on the turn-off gain is to be explained by means of calculated equipotential lines for a vertically offset gate-cathode structure according to FIG. 6. For the calculation, the following parameters were assumed which are typical of a structure of the above-mentioned type:

| | |
|---|---|
| Width of cathode regions ($X_E$) | 30 μm |
| Width of troughs 10 | 20 μm |
| Depth of troughs 10 ($Y_G$) | 15 μm |
| Thickness of total structure | 250 μm |
| Depth of intermediate layer 9 | 30 μm |
| Depth of anode layer 6 | 10 μm |
| Depth of cathode regions 3 | 5 μm |
| Depth of gate regions 8 ($X_p$) | 5 μm |
| Edge doping concentration of cathode regions 3 | $1 \times 10^{19}$ cm⁻³ |
| Edge doping concentration of the anode layer 6 | $5 \times 10^{18}$ cm⁻³ |
| Edge doping concentration of gate regions 8 | $1 \times 10^{16}$ cm⁻³ |
| Edge doping concentration of intermediate layer 9 | $8 \times 10^{14}$ cm⁻³ |
| Background doping concentration of channel layer 5 | $7 \times 10^{13}$ cm⁻³ |

From these parameters, the equipotential lines within the structure were calculated by the usual methods.

This results in the equipotential lines, shown in a section in FIG. 6, for the potential values of $-15$ V, 0 V, $+15$ V and $+150$ V with a gate voltage $U_{gk} = -15$ V and an anode voltage of $U_{ak} = 1600$ V. The structure according to the invention has a blocking capability of approximately 950 V with open gate contact.

Overall, the invention provides a component which has a clearly improved turn-off gain without change in the gate-cathode geometry and can be easily implemented with the usual methods familiar to the specialist in semiconductor technology.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the united states is:

1. A disconnectable power semiconductor component comprising:
    an anode and a cathode;
    a p-type anode layer located between said anode and said cathode;
    a n-type base layer formed above said anode layer; and
    a cathode-gate structure formed above said base layer at a cathode side, said cathode-gate structure comprising,
    a continuous intermediate layer having low p-type doping and being contiguous to said base layer,
    a plurality of n-type cathode regions on top of said intermediate layer, said cathode regions being separated from each other by troughs, which extend from said cathode side into said intermediate layer and have a bottom and side walls,
    a plurality of p-type gate regions, each of said gate regions extending both over said bottom and over said side walls of the respective of said troughs;
    wherein the gate regions of the side walls of neighboring of said troughs enclose between them a channel region; and
    wherein said intermediate layer separates said gate regions and said cathode regions from said base layer and has a doping concentration lower than that of said gate region.

2. A power semiconductor component according to claim 1, comprising:

said side walls of said troughs being perpendicular to the bottoms thereof;

said troughs having a width of between 10 μ and 30 μ and said cathode regions having a width of between 6 μ and 40 μ;

gate contacts in the form of a coherent metal layer formed on said gate regions; and said gate regions being in contact with said cathode regions and having a thickness of between 3 μ and 10 μ and a doping concentration of $2 \times 10^{16}$ cm$^{-3}$ at an exterior surface of said side walls.

3. A power semiconductor component according to claim 2, wherein the vertical distance between the bottom of said cathode regions and the bottom of said gate regions extending over the bottom of said troughs is greater than the width of said channel regions.

4. A power semiconductor component according to claim 2, comprising:

cathode contacts provided on said cathode regions and projecting by at least 1 μ into said troughs;

an insulation layer filling said troughs and covering said gate contacts and the trough side walls; and a continuous metal layer applied over said cathode contacts and said insulating layer, said continuous metal layer conductively connected to said cathode contacts.

5. A power semiconductor component according to claim 4, wherein:

said insulating layer consists of a polyimide;

said continuous metal layer comprises a sequence of layers Cr-Ni-Ag; and said cathode contacts and said gate contacts consist of Al.

6. A power semiconductor component according to claim 1, wherein said intermediate layer has a doping concentration less than $1 \times 10^{15}$ cm$^{-3}$.

7. A power semiconductor component according to claim 6, wherein said intermediate layer has a doping concentration of approximately $1 \times 10^{14}$ cm$^{-3}$.

8. A disconnectable power semiconductor component comprising:

an anode and a cathode;

a p-type anode layer located between the anode and the cathode;

a n-type base layer formed above said anode layer; and a cathode-gate structure formed above said base layer at the cathode side, said cathode-gate structure comprising, a plurality of n-type cathode regions on top of said base layer, said cathode regions being separated from each other by troughs, which extend from said cathode side into said base layer and have a bottom and side walls, a plurality of p-type gate regions, each of said gate regions extending both over said bottom and over said side walls of the respective of said troughs, whereby the gate regions of the side walls of neighboring of said troughs enclose between them a channel region;

said side walls of said troughs being perpendicular to the bottoms thereof, said troughs having a width of between 10 μ and 30 μ and said cathode regions having a width of between 6 μ and 40 μ, gate contacts in the form of a coherent metal layer formed on said gate regions, and said gate regions being in contact with said cathode regions and having at said side walls a thickness of between 2 μ and 10 μ and a doping concentration of $2 \times 10^{16}$ cm$^{-3}$ at an exterior surface of said side walls.

9. A power semiconductor component according to claim 8, wherein the vertical distance between the bottom of said cathode regions and the bottom of said gate regions extending over the bottom of said troughs is greater than the width of said channel regions.

10. A power semiconductor component according to claim 9, comprising:

cathode contacts provided on said cathode regions and projecting by at least μ into said troughs;

an insulation layer filling said troughs and covering said gate contacts and said trough side walls; and a continuous metal layer applied over said cathode contacts and said insulating layer, said continuous metal layer conductively connected to said cathode contacts.

11. A power semiconductor component according to claim 10, wherein:

said insulating layer consists of a polyimide; said continuous metal layer comprises a sequence of layers Cr-Ni-Ag; and said cathode contacts and said gate contacts consist of Al.

12. A disconnectable power semiconductor component comprising:

an anode and a cathode;

a p-type anode layer located between the anode and the cathode;

a n-type base layer formed above said anode layer; and a cathode-gate structure formed above said base layer at the cathode side, said cathode-gate structure comprising, a continuous intermediate layer having low p-type gate regions, which are alternately arranged at said cathode side;

wherein each of said gate regions and cathode regions extends from a common plane at said cathode side into said intermediate layer and is surrounded by said intermediate layer; and wherein said intermediate layer has a depth approximately twice the depth of said gate regions, both depths measured from said common plane at said cathode side, and has a doping concentration lower than that of said gate regions.

* * * * *